United States Patent [19]

Bluzer

[11] Patent Number: 4,814,844
[45] Date of Patent: Mar. 21, 1989

[54] SPLIT TWO-PHASE CCD CLOCKING GATE APPARATUS

[75] Inventor: Nathan Bluzer, Silver Spring, Md.

[73] Assignee: The United States of America as represented by the Secretary of the Air Force, Washington, D.C.

[21] Appl. No.: 940,888

[22] Filed: Dec. 12, 1986

[51] Int. Cl.⁴ .......................................... H01L 29/78
[52] U.S. Cl. ........................................ 357/24; 357/91
[58] Field of Search .................................... 357/24, 91

[56] References Cited

U.S. PATENT DOCUMENTS 3,796,933  3/1974  Arnett et al. ......................... 357/24
4,229,752 10/1980  Hynecek ............................. 357/24

Primary Examiner—Robert S. Macon
Attorney, Agent, or Firm—William Stephanishen; Donald J. Singer

[57] ABSTRACT

A split two-phase CCD clocking gate apparatus utilizing first and second phase regions for the storage and transfer of charge and a virtual phase region which is at a constant potential and separates the first and second phase regions.

10 Claims, 1 Drawing Sheet

SPLIT TWO-PHASE CCD CLOCKING GATE APPARATUS

STATEMENT OF GOVERNMENT INTEREST

The invention described herein may be manufactured and used by or for the Government for governmental purposes without the payment of any royalty thereon.

BACKGROUND OF THE INVENTION

The present invention relates broadly to a bulk channel CCD apparatus, and in particular, to a split two-phase CCD clocking gate apparatus.

Charge transfer devices may be throughout of as having three functional portions; namely, a signal input portion, where a signal is applied to the device for transforming such signal into a charge packet; a transfer portion, having a plurality of stages where the packet of charge or an accurate portion thereof is transferred from stage to stage; and a readout, output or sensing portion where the charge packet is converted to an electrical signal that is a representation of the charge packet. The operating frequency of charge transfer devices is usually limited by the operating speed of the input and output portions and structures.

The charge-coupled device comprises a capacitive semiconductor device having a potential well which can only store an incremental packet of charge. In addition, the charge-coupled device can also transfer that charge packet to an adjacent storage well or to an adjacent similar device. Thus, in a digital system, the presence or absence of a substantially full charge in a potential well, conveniently represents one or the other binary state, wherein data storage and transfer operations may be readily implemented. The charge-coupled devices are particularly advantageous for systems in which sequential processing and storage of long chains of binary values are required, such as in many real time processing and analysis systems. However, there are charge transfer inefficiencies which occur at each storage site, wherein a continuously diminishing charge packet would be transferred if the charge packet were not restored or regenerated periodically to its full level.

The charge-coupled device is essentially a metal-oxide semiconductor capacitor which is biased by an electrical field to create a substrate region that acts as a localized potential minimum for mobile carriers in a charge packet. The transfer of the mobile charge carriers from one storage site to another adjacent side is effected by the proper interrelationships between the voltages on adjacent electrodes. Therefore, it is possible to establish moving potential wells which ultimately carry the charge packets through substrate regions to a device in which the presence or absence of a charge packet is sensed.

The transfer inefficiencies of a charge-coupled device are the result of unavoidable imperfections in semiconductor and device manufacture. There are a number of ways that practitioners in the art have approached the solution to the problem. The most common expedient is to insert active elements in the system, however, this not only substantially increases the power requirements but also requires that a substantial amount of area be devoted to the regeneration function. It is of course desirable that the signal-to-noise ratio be adequately high to correspond to the very high reliability demanded of digital systems. Thus, a charge packet can only be allowed to diminish to that level at which point it may reliably be regenerated without more than a negligible chance of an error occurring, as determined by system reliability requirements. It is clear, however, that the lower the level of charge packet is relative to the 100 percent level, the fewer the number of regenerators that need be used and the greater the packing density of the charge-coupled device array.

The state of the art of single and split phase CCD clocking gate structures is well represented and alleviated to some degree by the prior art apparatus and approaches which are contained in the following U.S. Patents and which are incorporated herein by reference:

U.S. Pat. No. 3,796,933 issued to Arnett et al on Mar. 12, 1974; and

U.S. Pat. No. 4,229,752 issued to Hynecek on Oct. 21, 1980.

The Hynecek reference discloses a virtual phase charge transfer device wherein a portion of each cell includes an inversion layer at the semiconductor surface that functions as a virtual electrode shielding that region from any gate induced change in potential. The virtual layer in this reference utilizes a staircase potential. The Arnett et al. reference discloses a charge-coupled semiconductor device for transmitting information in the form of mobile charges through a depletion region which comprises an electrode structure in the surface of a semiconductor body.

In the prior art, virtual phase CCDs are made in shallow buried channels which have proved to be a very high yield technology. The advantages of virtual phase CCDs satisfy the need for a single clocking gate structures which have a very good electrical yield because there are no shorts between multi-phase gates that are contiguous and isolated from each other by several thousand angstroms of oxide. The operation of the virtual phase CCD structure is illustrated in FIG. 1a and 1b.

As the clock goes repulsive, the charge in the left most well in FIG. 1a under the clocked gate 10 spills into the virtual well (the area under the virtual gate). Simultaneously, the charge from the right most clock well (under clock gate 12) spills into the next virtual region (not shown). As the clocked gate is pulsed attractive, the charge from the virtual well moves to the right, that is, from the virtual well into the clocked well located on the right, i.e., under clock gate 12. The advantages of the virtual phase CCD structure is high yield, small pixels at the expense of poor charge handling capacity.

The reason that the charge handling capacity of the virtual phase is lower, is because the clocked well has to swing over a large potential voltage barrier. First, the clocked barrier of the clocked well has to swing below the level of the virtual well region. Secondly, this clocked potential well has to swing above the potential of the virtual barrier. These levels are illustrated in FIG. 1b which is a potential well diagram for the CCD structure of FIG. 1a. Therefore, if the barrier in the clocked region is $\theta_a$ and the barrier in the virtual region is $\theta_b$ the clocked well has to swing $\theta_a + \theta_b$ volts. If there were two phases with overlapping geometry, for the same charge capacity, the swing will be $\theta_a$. Clearly, a large penalty in charge capacity is paid with the virtual phase CCD because larger clock swings are needed for a given charge handling capacity. If $\theta_a = \downarrow_b$ the clock swing relation between virtual phase and two phase are two to one in clock voltage swing. Practically speaking, the clock swing in a CCD is limited to 10-20 vdc so the larger clock swings are not practical to compensate for reduction in charge handling capacity with the virtual phase CCD. A two to one charge handling capacity reduction is a difficult feature to give up. This need not be so if the CCD geometry employed is different from a two-phase and/or a virtual phase CCD geometry. The present invention is directed to achieving the above advantages and results.

SUMMARY OF THE INVENTION

The present invention utilizes a two-phase charge coupled device (CCD) gate structure which includes a first phase region, a flat potential virtual region, and a second phase region. The virtual region is at a constant potential and is very narrow. When the first phase region is repulsive and the second phase region is attractive, charge will be transferred from the first phase well through the virtual region from left to right into the second phase well. When the first phase region goes attractive and the second phase region is repulsive, the charge will be transferred through the virtual region on the right of the second phase well into the next first phase well. The shorting problem that is associated with conventional two phase CCDs is eliminated because there is a wide gap relative to the thickness of an insulator ($\approx 2000$Å) between the clocking phases of the present invention.

It is one object of the present invention, therefore, to provide an improved two-phase CCD clocking gate apparatus through the use of a virtual region between phases.

It is another object of the invention to provide an improved two-phase CCD clocking gate apparatus labeled as split two phase wherein shorting between clocking gates is eliminated by gaps that are formed between $\theta_a$ and $\theta_b$ clock gates.

It is still another object of the invention to provide an improved split two-phase CCD clocking gate apparatus wherein non-overlapping clock gates $\theta_a$ and $\theta_b$ can be formed with the same layer thereby reducing the fabrication complexity through a reduction in the number of gate layers that are required.

It is yet another object of the invention to provide an improved split two-phase CCD clocking gate apparatus wherein a monopotential is utilized in the virtual region and the number of masks to fabricate the CCD structure is reduced, thereby simplifying fabrication.

It is yet another object of the invention to provide an improved split two-phase CCD clocking gate apparatus wherein the charge capacity for a given clock swinging is increased by a two fold capacity.

It is still another object of the invention to provide an improved split two-phase CCD clocking gate apparatus wherein a lower field potential is established in the virtual region.

It is still another object of the invention to provide an improved split two-phase CCD clocking gate apparatus wherein the reduction of fields reduces the probability of carrier generation through avalanche effects.

It is yet another object of the invention to provide an improved split two-phase CCD clocking gate apparatus wherein the P+ virtual layer can be formed by a self-aligned process to the edges of $\theta_a$ and $\theta_b$ clocking gates.

These and other advantages, objects and features of the invention will become more apparent after considering the following description taken in conjunction with the illustrative embodiment in the accompanying drawings.

BRIEF DESCRIPTION OF THE DRAWINGS

FIG. 1b is a potential well diagram that is associated with the apparatus of FIG. 1a;

FIG. 2b is a potential well diagram that is associated with the apparatus of FIG. 2a.

DETAILED DESCRIPTION OF THE PREFERRED EMBODIMENT

Figure 1A:
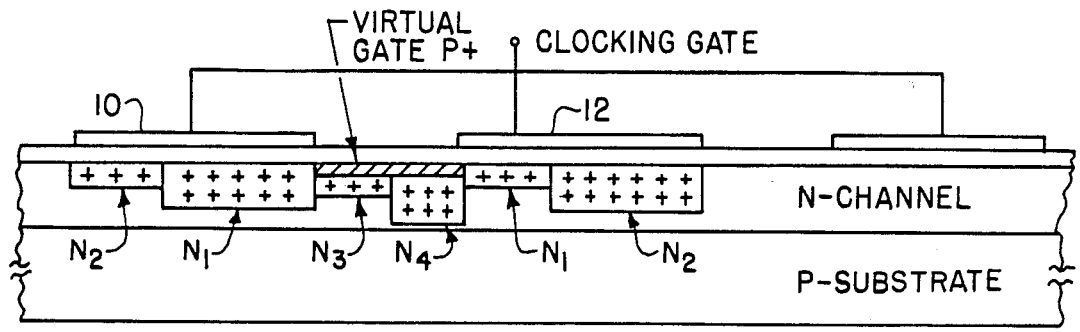
FIG. 1a is a partial view of a prior art embodiment of a virtual phase CCD apparatus.
Figure 1B:
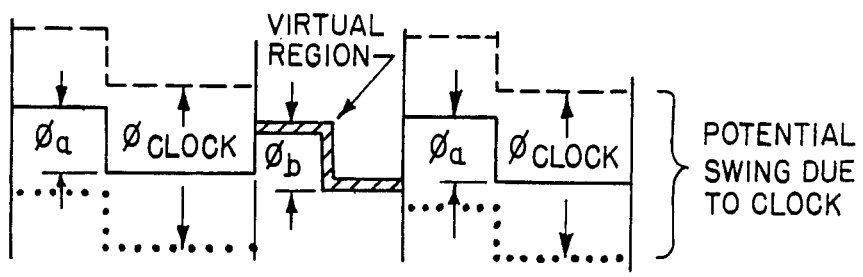
Figure 2A:
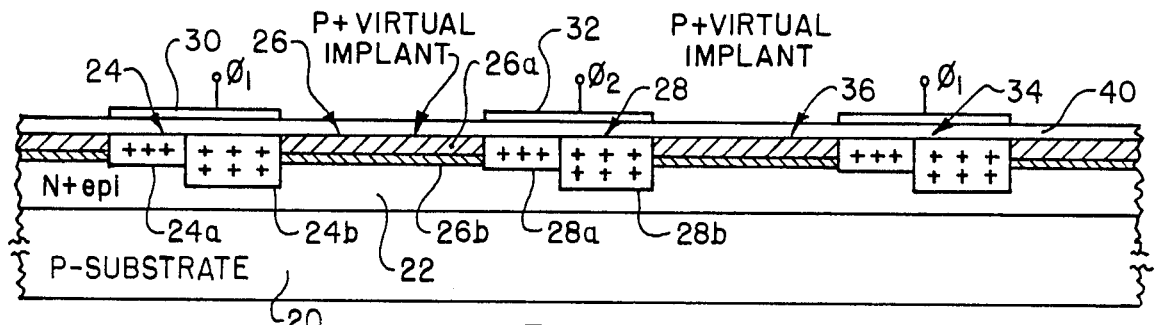
FIG. 2a is a partial view of the split two-phase CCD clocking gate apparatus according to the present invention.

Referring now to FIG. 2a, there is shown a partial view of the split two-phase CCD clocking gate apparatus which is a bulk channel device. The split two-phase CCD clocking gate apparatus comprises a p-type substrate 20 with an n-type layer 22 deposited thereon. It should be noted that the layer 22 may be established on a substrate 20 by any of the well known conventional methods, such as, specifically, epitaxial growth or ion implantation. The substrate 20 may comprise any suitable commercially available materials such as p-type Si. A unit CCD section is formed in the layer 22. This unit CCD section comprises a first phase region 24, and a flat potential virtual region 26. A second unit CCD section is shown and it comprises a second phase region 28 and a flat potential virtual region 36. These unit CCD sections can be continued as shown to form a CCD apparatus as large as is necessary for a given application or operation. Since the unit CCD sections are identical, the present apparatus will be described with respect to a single unit CCD section. It should be noted that the first phase region 24 comprises a first and second N doped region 24a, 24b and that the second phase region 28 also comprises a first and second N doped region 28a, 28b. The virtual gate region 26 comprises a P+ doped region 26a on top of an N doped region 26b. An insulating layer 40 which may comprise any of the well known conventional insulating materials insulates the three different regions from the respective clocking gates 30, 32. At this point it may well be noted that the basic structure of the CCD apparatus which comprises the three different regions and their associated clocking gates may be repeated in the apparatus as a particular application may require. The discussion herein was confined to the three regions under the first and second phase clock gates for simplicity. Furthermore, it should be readily understood that the present apparatus may utilize more than two clock gate phases, e.g., three, four etc. It should be well recognized from FIG. 2a that the CCD regions are repeatable ad finitem and while two clock gate phases are shown, that any number of alternating clock gate phases may be used. In actual practice, the first and second phase regions 24, 28 comprise similar construction and dopant concentrations but their respective clocking gates 30, 32 receive opposite (mutually exclusive) clocking signals. In the present apparatus, the P-substrate 20 is approximately 500 microns thick and is doped with a P dopant such as Boron. The dopant concentration is in the area of $2 \times 10^{14}$ dopants/cubic centimeter. The N-epi layer 22 which has a thickness of 4 microns, has concentration of $7 \times 10^{14}$ dopants-cm$^{-3}$. Suitable N-dopants are phosphorous or arsenic. The first N doped regions 24a, 28a may have a dopant concentration, $N_1$, or zero (0) or less than $N_2$, the second N doped regions, 24b, 28b. The $N_2$ concentration is approximately $2 \times 10^{16}$ dopants-cm$^{-3}$. The P+ doped region 26a has a concentration of $5 \times 10^{18}$ dopants-cm$^{-3}$ or greater. The N doped region 26b has a concentration of $2 \times 10^{16}$ dopants-cm$^{-3}$. The insulator 40 has a thickness of 100 nano-meters.

Figure 2B:
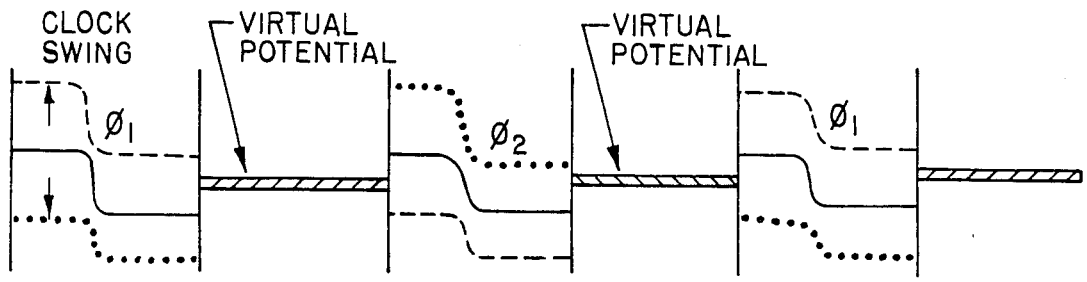

There is associated with the apparatus in FIG. 2a the potential well diagram of FIG. 2b. The split two-phase CCD clocking gate apparatus operates in the following manner. The virtual gate region 26 is held at a constant potential and should be as narrow as possible ($\approx 1$ μm) in size. When the first phase clock signal $\theta_1$ is repulsive and the second phase clock signal $\theta_2$ attractive, charge will be transferred from the $\theta_1$ potential to the $\theta_2$ well through the virtual transition region from left to right. When the first phase clock signal $\theta_1$ at gate 30 goes attractive and the second phase clock signal $\theta_2$ at gate 32 goes repulsive, the charge will be transferred from $\theta_2$ potential well to the right and into adjacent $\theta_1$ potential well 34 through the virtual phase region 36. The minimum clock swing required is $\theta_a$ or the same amount as the two-phse device and ¼ the clock swing of a virtual phase CCD. However, $\theta_1$ and $\theta_2$ gates 30, 32 are isolated from each other by a physical gap and not like in a conventional two-phase CCD where only a several thousand angstrom oxide is isolating overlapping CCD phases. Thus, the short problem in conventional two-phase CCD should be eliminated because there is a wide gap between clock phases compared to an insulating oxide between CCD gates. The present CCD apparatus is an N-channel device, it will be obvious to those skilled in the art that this concept may be utilized for P channel devices also.

Although the invention has been described with reference to a particular embodiment, it will be understood to those skilled in the art that the invention is capable of a variety of alternative embodiments within the spirit and scope of the appended claims, wherein more than two clock gate phases, e.g., three, four etc. may be utilized.

What is claimed is:

1. A split two-phase CCD clocking gate apparatus comprising in combination:
    a substrate of P-type semiconductor material,
    a layer of N-type semiconductor material deposited atop said substrate,
    a first phase region formed in said layer of N-type semiconductor material,
    a virtual phase region formed in said N-type semiconductor material adjacent to and in electrical contact with said first phase region,
    a second phase region formed in said layer of N-type semiconductor material adjacent to and in electrical contact with said virtual phase region,
    a thin layer of insulating material deposited atop said layer of N-type semiconductor material covering all three regions formed in said layer of N-type semiconductor material,
    a first clocking gate formed on said thin layer of insulating material over said first phase region, said first clocking gate receiving a first phase clock signal, and,
    a second clocking gate formed on said thin layer of insulating material over said second phase region, said second clocking gate receiving a second phase clock signal, charge in the potential well in said first phase region will be transferred through said virtual phase region to the potential well in said second phase region when said first phase clock signal is repulsive and said second phase clock signal is attractive.

2. A split two-phase CCD clocking gate apparatus as described in claim 1 wherein said first phase region comprises in combination a first and second doped region, adjacent to each other, with different concentrations of N-dopant.

3. A split two-phase CCD clocking gate apparatus as described in in claim 1 wherein said second phase region comprises in combination a first and second doped region, adjacent to each other, with different concentrations of N-dopant.

4. A split two-phase CCD clocking gate apparatus as described in in claim 1 wherein said virtual phase region comprises in combination a first and second implant region, said first implant region positioned atop of said second implant region, said first implant region being doped with a predetermined concentration of P-dopant, said second implant region being doped with a predetermined concentration of N-dopant.

5. A split two-phase CCD clocking gate apparatus as described in claim 1 wherein a clock signal that is repulsive is more negative than a clock signal that is attractive.

6. A split two-phase CCD clocking gate apparatus as described in claim 2 wherein the concentration of N-dopant of said first doped region is less than the concentration of N-dopant of said second doped region.

7. A split two-phase CCD clocking gate apparatus as described in claim 3 wherein the concentration of N-dopant of said first doped region is less than the concentration of N-dopant of said second doped region.

8. A split two-phase CCD clocking gate apparatus as described in claim 4 wherein said virtual phase region is at a constant potential.

9. A split two-phase CCD clocking gate apparatus as described in claim 4 wherein said virtual phase region has a predetermined width that is very narrow.

10. A split two-phase CCD clocking gate apparatus as described in claim 9 wherein said predetermined width is approximately 1 micron.

* * * * *